United States Patent [19]

Pong et al.

[11] Patent Number: 5,210,056

[45] Date of Patent: May 11, 1993

[54] METHOD FOR FORMING A GATE OXIDE FILM OF A SEMICONDUCTOR DEVICE

[75] Inventors: Chil-kun Pong, Seoul; Myeon-koo Kang, Suwon; Yang-koo Lee; Dong-ho Shin, both of Seoul, Rep. of Korea

[73] Assignee: Samsung Electronics Co., Ltd., Kyunggi, Rep. of Korea

[21] Appl. No.: 799,052

[22] Filed: Nov. 27, 1991

[30] Foreign Application Priority Data

Aug. 22, 1991 [KR] Rep. of Korea ............ 91-14534

[51] Int. Cl.$^5$ ............................................. H01L 21/02
[52] U.S. Cl. ................................. 437/239; 437/247; 437/248; 437/983; 437/941
[58] Field of Search ............ 437/247, 239, 248, 983, 437/941, 979

[56] References Cited

U.S. PATENT DOCUMENTS

| | | | |
|---|---|---|---|
| 3,615,873 | 10/1971 | Sluss | 437/247 |
| 3,925,107 | 12/1975 | Gdula et al. | 437/247 |
| 3,978,577 | 9/1976 | Bhattacharyya et al. | 437/236 |
| 4,027,380 | 6/1977 | Deal et al. | 437/239 |
| 4,214,919 | 7/1980 | Young | 437/239 |
| 4,784,975 | 11/1988 | Hoffmann et al. | 437/247 |
| 4,851,370 | 7/1989 | Doklan et al. | 437/247 |

*Primary Examiner*—Brian E. Hearn
*Assistant Examiner*—Trung Dane
*Attorney, Agent, or Firm*—Rothwell, Figg, Ernst & Kurz

[57] ABSTRACT

A fabrication method of a semiconductor device is disclosed. Particularly, in the process of forming a gate oxide film on a semiconductor substrate, the method for forming a gate oxide film of a semiconductor device comprises the steps of first-annealing the semiconductor substrate in a nitrogen ($N_2$) atmosphere; forming a gate oxide film by wet-oxidizing the annealed semiconductor substrate at a low temperature in a mixed gas atmosphere of oxygen ($O_2$) and hydrogen ($H_2$); and second-annealing the semiconductor substrate where gate oxide film has been formed, at a high temperature in a nitrogen ($N_2$) atmosphere. Accordingly, the thinning phenomenon of the gate oxide film near the field oxide film is prevented and the instability such $V_{FB}$ in the conventional field oxidation method is considerably recovered. Also, the field concentration phenomenon is decreased and tolerance to dielectric breakdown is increased.

6 Claims, 4 Drawing Sheets

METHOD FOR FORMING A GATE OXIDE FILM OF A SEMICONDUCTOR DEVICE

BACKGROUND OF THE INVENTION

The present invention relates to a method for manufacturing a semiconductor device, and more particularly to a method for forming a gate oxide film of a semiconductor device, which results in a highly reliable transistor by increasing its tolerance to dielectric breakdown.

Many studies have been performed showing that the reliability of the gate oxide film is a major factor determining the reliability of a MOS transistor in a semiconductor memory device. Beside the dielectric breakdown of the gate oxide film, several other factors determine the reliability, productivity, and lifetime of a MOS transistor. These include such process conditions as: crystallization of the silicon wafer, the cleaning and surface processing methods, the oxidation temperature, atmosphere, and thickness, the annealing temperature and atmosphere, the gate electrode material, which gas and/or chemicals are used, wafer purity, and the cleanness of the atmosphere.

The main reason for dielectric breakdown of the gate oxide film is local defects within the film, which are generated by lattice defects such as particles, carbon precipitates, stacking faults, metallic contamination, (from Cu, Ni, Fe, etc.) and the contamination of the oxide film (particularly from Na+).

Generally, a semiconductor is oxidized by one of several different methods, e.g., thermal oxidation, electrochemical anode oxidation, plasma reaction, etc. Among these, thermal oxidation is currently the most important method of fine processing techniques for manufacturing semiconductor devices and is used as the main process. A thermal oxidation method may be a wet oxidation method which forms an oxide film using $O_2$ and $H_2$ gases or vaporized $H_2O$ or a dry oxidation method which uses $O_2$ and HCl gases to form the oxide film. Between these two, the dry oxidation method which can better control the formation of a thin film and can obtain a high quality oxide film is often used in the oxidation process for forming a gate oxide film.

In an oxidation mechanism for forming a silicon dioxide ($SiO_2$) by reaction between the silicon and oxygen atoms, the interface the between the silicon and the oxide film extends into the silicon during the oxidation process. This is because the silicon atoms are oxidized by the oxygen atoms. Generally, approximately 44% of the overall oxide film thickness penetrates below the original silicon surface. At this time, the contaminant on the silicon surface, e.g., metal ions, natrium ions, etc., penetrates the oxide film, then accumulates an undesired charge ($Q_{ox}$; oxidized substrace charge), thereby forming a new energy level within the oxide film. The remaining ion atoms which have not been bonded accumulate in the interface between the silicon and the oxide film the undesired charge ($Q_{ss}$; surface state charge). The charges increase the variation of the MOS transistor's flat band voltage ($\Delta v_{FB}$) in an oxide film such as a gate oxide film which should control the threshold voltage ($v_T$). The influence of these charges ($Q_{ss}$ and $Q_{ox}$) is why the device's reliability and its electrical characteristics deteriorate. The following two equations clearly show the relations:

$$\Delta V_{FB} = \Phi_{ms} - \frac{Qi}{Ci} \quad (1)$$

$$(Qi = Q_{ox} + Q_{ss})$$

$$V_T = \Phi_{ms} - \frac{Qi}{Ci} - \frac{Qd}{Ci} + 2\phi_F \quad (2)$$

where,
$\Phi_{ms}$: a difference between work functions of metal and silicon (always a negative value) ($\Phi_{ms} = \Phi_m - \Phi_s$)
$Qi$: charge of the whole oxide film
$Ci$: capacitance of the whole oxide film
$V_T$: threshold voltage
$Q$: charge in the depletion region
$\phi_F$: a difference between an intrinsic level and $$\left(\phi_F = \frac{Ei - E_F}{q}\right)$$

As described above, the dry oxidation method for forming an oxide film by supplying an oxygen gas ($O_2$) and a hydrogen chloride (HCl) gas is frequently used in an oxidation process for forming a gate oxide film since film thickness is better controlled and a high quality oxide film can be formed. At this time, since the HCl prevents the gate oxide film from being contaminated due to the natrium ion (Na+) in a clean room having low cleanness, it is supplied to prevent the oxidized substance charge ($Q_{ox}$) from being formed within the gate oxide film.

However, since modern clean rooms have been so improved, the HCl supplied to prevent the contamination of the oxide film can itself be the source of contamination. It has been reported that micropores or a fine defects exist within the oxide film formed by the dry oxidation method. Micropores or fine defects partially weaken the oxide film, increasing internal stress or causing a local field concentration phenomenon. This is a primary cause for the dielectric breakdown of an oxide film, thereby increasing the gate oxide film's perceptibility to dielectric breakdown and accordingly deteriorating reliability, productivity and lifetime of the semiconductor device.

FIGS. 1A and 1B illustrate process conditions of the conventional dry oxidation method for forming a gate oxide film and show a cross-sectional view of the gate oxide film manufactured according to the process conditions.

After a semiconductor substrate is annealed at a temperature of 650° C. in a nitrogen ($N_2$) atmosphere, oxygen ($O_2$) is supplied while the substrate temperature is increased to 950° C. At this time, the hydrogen chloride (HCl) gas is supplied to prevent the oxide film from being contaminated due to the metal ions, natrium ions, etc. Then, after the oxide film is grown to a desired thickness, the supply of oxygen and hydrogen chloride is stopped. The substrate is then annealed in the nitride atmosphere while the substrate temperature is decreased to approximately 650° C. This completes the gate oxide film formation by the conventional dry oxidation method and according to the process conditions of FIG. 1A.

FIG. 1B is a cross-sectional view showing a section A of a gate oxide film 14 manufactured according to the process conditions of FIG. 1A, and shows that the gate oxide film is deteriorated at point B by micropores 50 or thinned oxide film 60 near field oxide film 12 due to the white ribbon.

The white ribbon is a combined substrate formed by combining the nitride material used as an oxidation preventing material and silicon particles on the substrate near the oxidation preventing material during the oxidation process for forming field oxide film 12. The combined substance prevents the semiconductor substrate from being oxidized by the oxidation process during the formation of the gate oxide film. The combined substance also makes the oxide film thinner where it has been formed than where not. This results in causing the field concentration phenomenon, and accordingly becomes a factor for the dielectric breakdown of the gate oxide film.

Besides the aforementioned dry oxidation method, the gate oxide film can be formed by a wet oxidation method. The gate oxide film formed by the wet oxidation method makes for less increased stress from micropores within the oxide film, and reduces the local field concentration phenomenon, both of which were problems in the dry oxidation method. However, the oxidized substance charge ($Q_{OX}$) and the surface state charge ($Q_{SS}$), etc. are much more predominant than those in the gate oxide film manufactured by the dry oxidation method, which increases the flat band voltage variation ($\Delta v_{FB}$). Accordingly, it deteriorates the electrical characteristics of the device.

SUMMARY OF THE INVENTION

It is an object of the present invention to provide a method for forming a gate oxide film of a semiconductor device having an increased tolerance to dielectric breakdown.

To achieve the object, in a process of forming a gate oxide film on a semiconductor substrate, the method for forming a gate oxide film of the semiconductor substrate according to the present invention comprises the steps of:

first-annealing the semiconductor substrate in a nitrogen ($N_2$) atmosphere;

forming a gate oxide film by wet-oxidizing the annealed semiconductor substrate at a low temperature in a mixed gas atmosphere of oxygen ($O_2$) and hydrogen ($H_2$); and second-annealing the semiconductor substrate where the gate oxide film has been formed, at a high temperature in a nitrogen ($N_2$) atmosphere.

The gate oxide film manufactured by the present method uses the low-temperature wet oxidation method, so that the microdefect due to micropores does not occur and thus the dielectric breakdown of the oxide film (a problem in the dry oxidation method) due to the stress within the oxide film and the local field concentration phenomenon can be prevented. Moreover, since the substrate is annealed in a nitrogen atmosphere before and after the oxidation process, thereby decreasing the surface state charge ($Q_{SS}$) to decrease the variation of the flat band voltage ($\Delta V_{FB}$). Also, since the sacrificial oxidation process is performed, the thinning of the gate oxide film near the field oxide film due to the white ribbon is prevented.

BRIEF DESCRIPTION OF THE DRAWINGS

The above object and other advantages of the present invention will become more apparent by describing the preferred embodiment of the present invention with reference to the attached drawings, in which.

DETAILED DESCRIPTION OF THE INVENTION

Hereinafter, the present invention will be described with reference to the accompanying drawings.

Figure 1A:
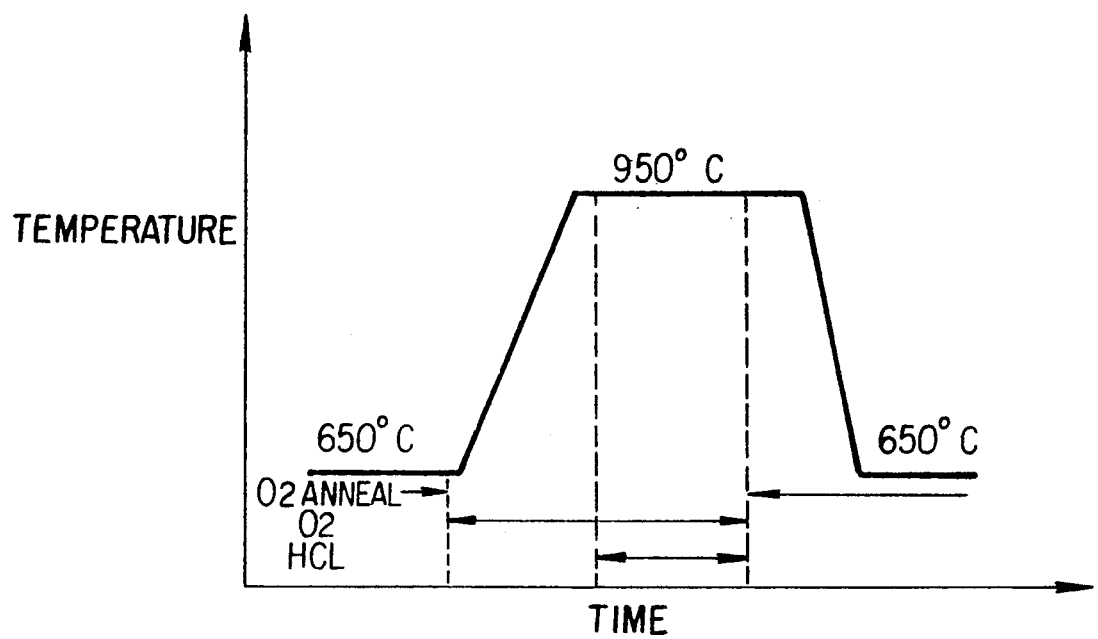
FIG. 1A is a graph showing the conditions for forming a gate oxide film by the conventional method.
Figure 1B:
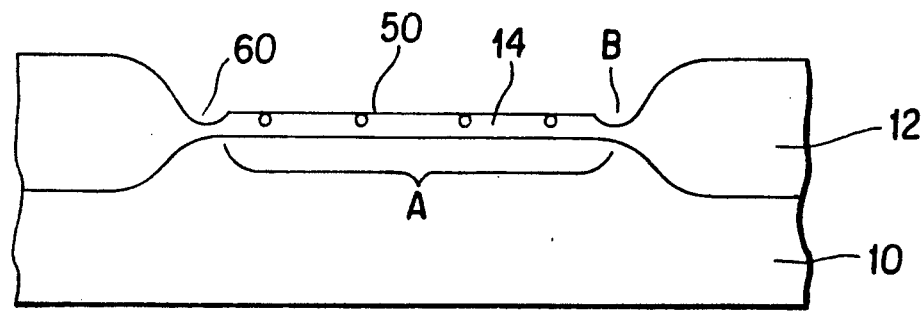
FIG. 1B is a cross-sectional view showing the gate oxide film manufactured by the conditions of FIG. 1A.
Figure 2A:
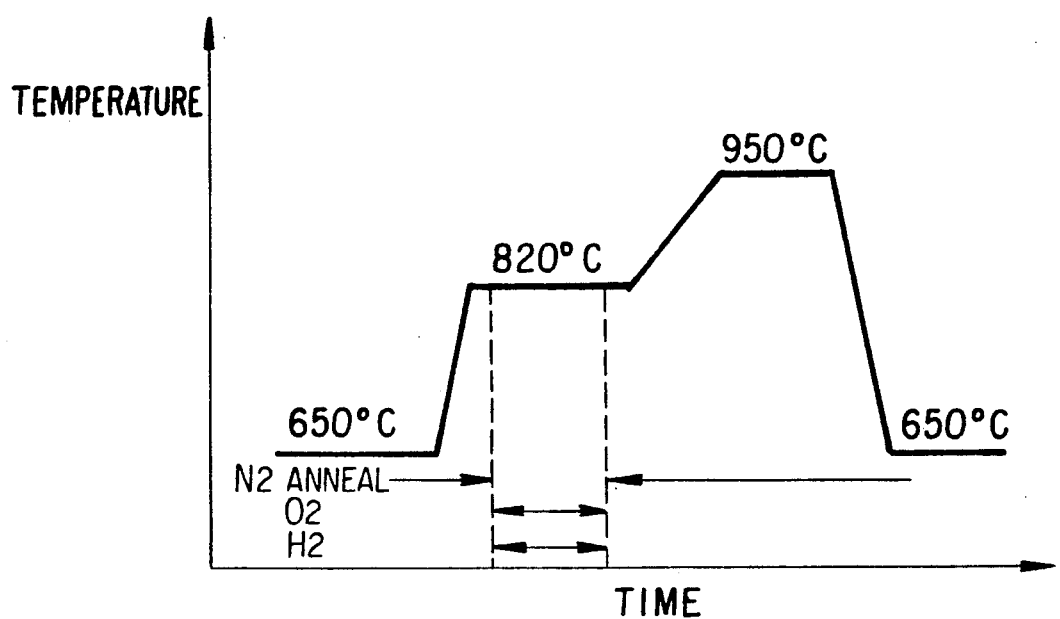
FIG. 2A is a graph showing the conditions for forming the gate oxide film by the present invention.
Figure 2B:
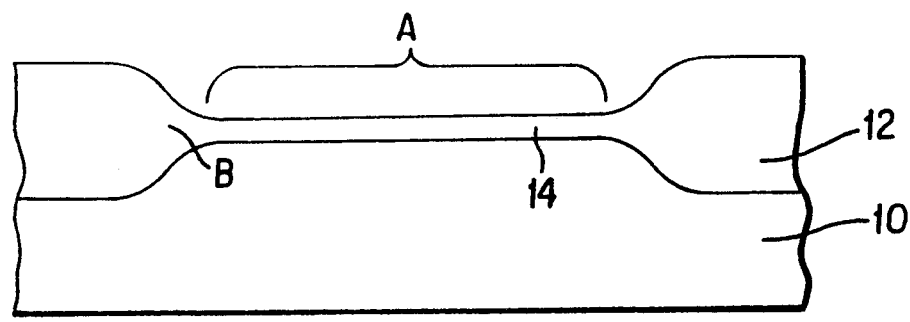
FIG. 2B is a cross-sectional view showing the gate oxide film manufactured by the conditions of FIG. 2A.

FIGS. 2A illustrates the oxidation conditions for forming a gate oxide film by the present method and according to oxidation time, while FIG. 2B is a cross-sectional view showing a gate oxide film manufactured by those conditions. More specifically, FIG. 2B illustrates a gate oxide film 14 manufactured by the conditions of FIG. 2A, showing a gate oxide film which does not have fine defects such as micropores, or exhibit the thinning phenomenon wherein the gate oxide film thins near the field oxide film. Here, A and B designate the same references as the prior art.

The fabrication sequence of a gate oxide film according to the method of the present invention will be described as applied to a general CMOS fabrication process.

To form a P-type well on a N-type semiconductor substrate where a NMOS transistor will be formed, an P-type impurity is deposited on a region where the NMOS transistor will be formed. There after, a well-drive in process is performed, thereby completing the P-type well.

Then, after a nitride film is used as an oxidation preventing material to form a field oxide film for dividing the semiconductor substrate into an active region and an inactive region, the nitride film is removed and a sacrificial oxidation for removing the white ribbon is carried out. Here, in the sacrificial oxidation which is an additional oxidation and etching process carried out to remove the white ribbon, the whole surface of the semiconductor substrate where the white ribbon has been formed is thinly oxidized by a process of forming a field oxide film. Then, an etching process is performed to etch the oxide film formed on the whole semiconductor substrate. The white ribbon is removed together with the oxide film by the etching process.

After the aforementioned processes for manufacturing the gate oxide film, an alkaline cleaning solution, $SC_1$, i.e., $1NH_4OH:1H_2O_2:19H_2O$, and a $SC_1+HF$ cleaning solution are used to wash the semiconductor substrate where the white ribbon was removed by the sacrificial oxidation. This is for effectively removing the natural oxide film and the organic and inorganic matter, etc., by lightly washing the surface of semiconductor substrate with the above cleaning solution. The ratio of the cleaning solution, i.e., $NH_4OH:H_2O_2:H_2O$ may be 1:1~5:3~100. Then, the semiconductor substrate is put into an oxide film growth tube and is first-annealed, e.g., at a temperature of approximately 650° C., in a nitrogen ($N_2$) atmosphere as shown in FIG. 2A. This causes damage generated in the substrate due to the well-drive-in, sacrificial oxidation and cleaning process, to be cured and the roughness of the surface of the semiconductor substrate to lessen. Then, immediately, the gate oxide film is grown at an oxygen and hydrogen gas atmosphere. During this gate oxide film growth, the temperature of the substrate is about 820° C., which generates an $OH^-$ radical, thereby effectively inhibiting the creation of micropores or fine defects, to decrease the stress of the oxide film. Thus, a uniform film can be formed which exhibits no local field concentration phenomenon. After the gate oxide film growth, a second-annealing process proceeds within the above tube in a nitrogen atmosphere, at a high temperature, e.g., approximately 950° C. and decreases the surface state charge $Q_{SS}$ by changing the interface state between the semiconductor substrate and the oxide film. Then, the gate electrode is manufactured by depositing the polycrystalline silicon and by doping the phosphor using $POCl_3$.

TABLE 1

| Oxidation | Ratio of oxide film thicknesses of A and B regions shown in FIGs. | BV (MV/cm) | Q (C/cm$^2$) | poor rate of reliability |
|---|---|---|---|---|
| dry (prior art) | 89.5% (B/A) | 7.5 | 15 | 20% |
| Wet (present invention) | 97.1% (B/A) | 8.2 | 27 | 10% |

The table 1 compares the characteristics between the oxide film manufactured by the conventional dry oxidation method and the oxide film manufactured by the present wet oxidation method. It is known that the oxide film manufactured by the present method is much improved in its characteristics than that manufactured by the conventional method.

Figure 3A:
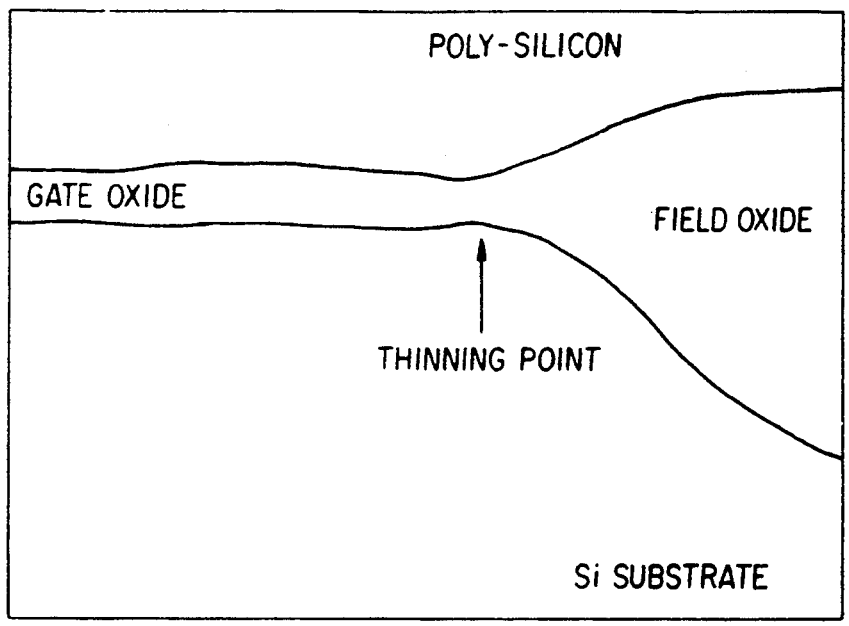
FIGS. 3A and 3B are illustrations of TEM photographs of the gate oxide films manufactured by the conventional method and the present method, respectively.
Figure 3B:
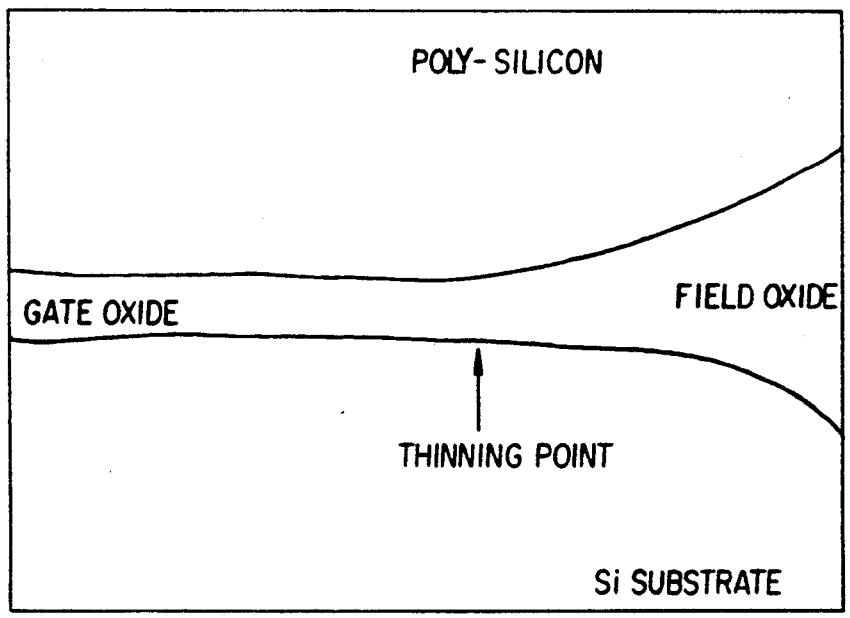

FIGS. 3A and 3B are illustrations of TEM photographs of gate oxide films manufactured by the conventional method and the present method, respectively. The photographs demonstrate that the gate oxide film in FIG. 3B manufactured by the present method using the wet oxidation method, is further improved over that shown in FIG. 3A which is manufactured by the conventional method using the dry oxidation method.

Figure 4:
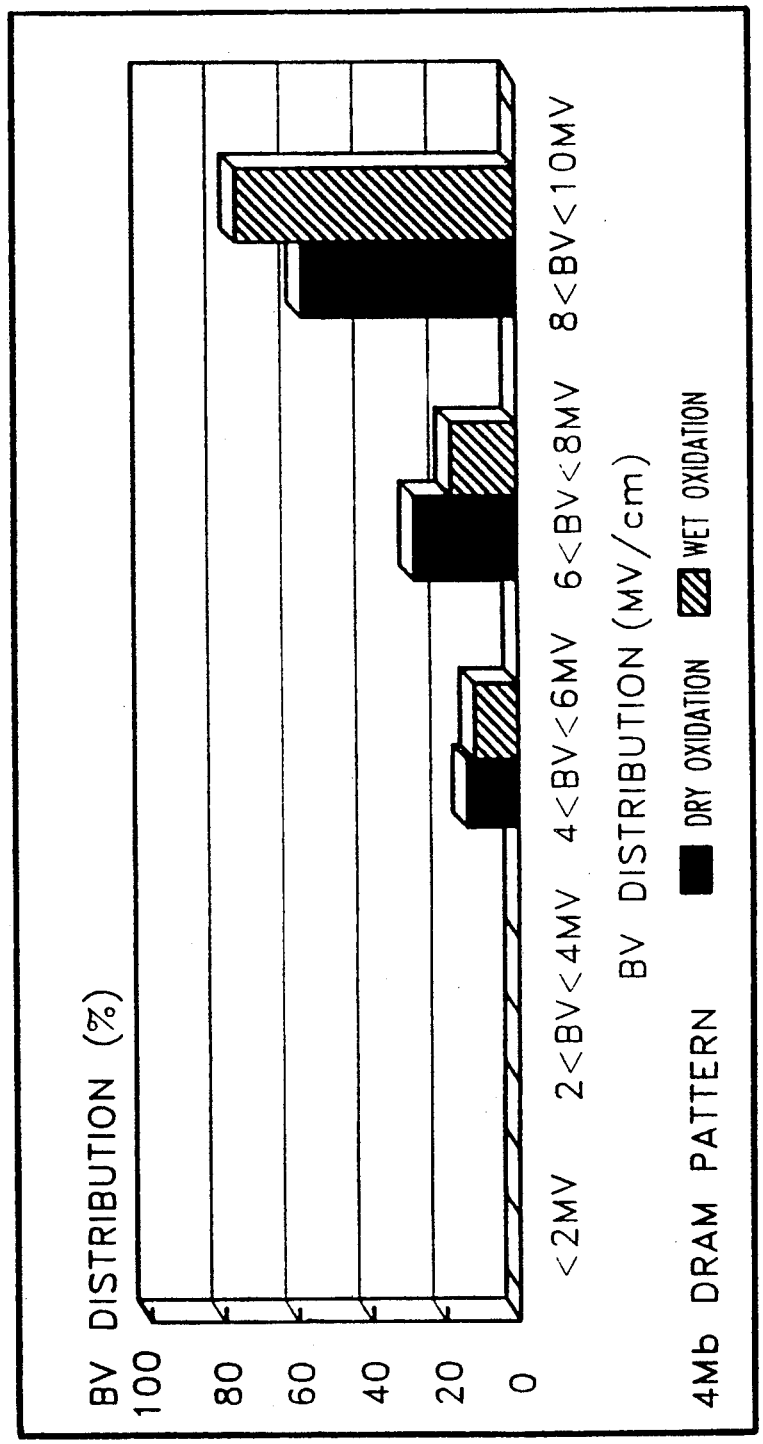
FIG. 4 is a graph showing the breakdown voltage characteristic of gate oxide films manufactured by dry oxidation, and wet oxidation methods of the present invention.

From FIG. 4 which is a graph showing various breakdown voltage characteristics of the gate oxide films manufactured by the dry oxidation method and the wet oxidation method of the present invention, it is known that the breakdown voltage characteristic of the gate oxide film manufactured by the method of the present invention is further improved.

The method for forming a gate oxide film according to the present invention performs the sacrificial oxidation to prevent the thinning phenomenon of the gate oxide film near the field oxide film due to the white ribbon, and controls by the wet oxidation method the locally thinning phenomenon which exists even after the sacrificial oxidation. Also, the annealing process is performed before and after the oxidation process to decrease the surface state charge and accordingly decrease the variation of the flat band voltage ($\Delta V_{FB}$), so that the $\Delta V_{FB}$ instability of the conventional wet oxidation method is lessened considerably. Moreover, since the present method uses the low-temperature wet oxidation method, the generation of fine defects such as micropores due to the generation of the $OH^-$ radical is inhibited, thereby decreasing the local field concentration phenomenon due to the decrease of the stress within the oxide film. Accordingly, a high quality gate oxide film can be obtained which enjoys an increased tolerance to the dielectric breakdown.

The present invention is not limited in the above embodiment and it is clear that various changes can be practiced by those skilled in the art, without departing from the scope of the technical idea of the present invention.

What is claimed is:

1. In a process of forming a gate oxide film on a semiconductor substrate, a method for forming a gate oxide film of a semiconductor device, comprising the steps of:

first-annealing said semiconductor substrate in a nitrogen ($N_2$) atmosphere while the substrate temperature is increased from approximately 650° C. to approximately 820° C.;

forming a gate oxide film by wet-oxidizing said annealed semiconductor substrate at approximately 820° C. in a mixed gas atmosphere of oxygen ($O_2$) and hydrogen; and second-annealing said semiconductor substrate where the gate oxide film has been formed, in a nitrogen ($N_2$) atmosphere while said substrate temperature increased from approximately 820° C. to approximately 950° C., and then decreased to 650° C.

2. A method for forming a gate oxide film of a semiconductor device as claimed in claim 1, further comprising a step of alkali-cleaning the surface of said semiconductor substrate before said step of first-annealing said semiconductor substrate.

3. A method for forming a gate oxide film of a semiconductor device as claimed in claim 2, wherein said alkali-cleaning step is processed with the ratio of $NH_4OH:H_2O_2:H_2O$ being 1:1~5:3~100

4. A method for forming a gate oxide film of a semiconductor device as claimed in claim 3, wherein said alkali-cleaning step is processed using a $SC_1$ cleaning solution ($1NH_4OH:1H_2O_2:19H_2O$).

5. A method for forming a gate oxide film of a semiconductor device as claimed in claim 2, wherein said alkali-cleaning step is processed using a $SC_1+HF$ cleaning solution.

6. A method for forming a gate oxide film of a semiconductor device as claimed in claim 2, further comprising the steps of:

(a) forming a sacrificial oxide film on the semiconductor substrate where a white ribbon has been formed by a field oxide film formation process; and (b) removing said white ribbon by an etching process for removing said sacrificial oxide film, before said alkali-cleaning step.

* * * * *

UNITED STATES PATENT AND TRADEMARK OFFICE
CERTIFICATE OF CORRECTION

PATENT NO. : 5,210,056
DATED : May 11, 1993
INVENTOR(S) : Pong et al.

It is certified that error appears in the above-identified patent and that said Letters Patent is hereby corrected as shown below:

Col. 1, line 63, "$\nu$" should be --V--.

Col. 1, line 65, "$\nu$" should be --V--.

Col. 2, line 17, add the caption --the Fermi level--.

Col. 3, line 28, "$\nu$" should be --V--.

Col. 5, line 47, "photographs" should be --illustrations--.

Signed and Sealed this

Twelfth Day of April, 1994

Attest:

BRUCE LEHMAN

Attesting Officer

*Commissioner of Patents and Trademarks*